(12) United States Patent
Liu

(10) Patent No.: US 7,714,339 B2
(45) Date of Patent: May 11, 2010

(54) LIGHT EMITTING DIODE

(75) Inventor: Shuan-Ta Liu, Taipei (TW)

(73) Assignee: Neoton Optoelectronics Corp., Taipei (TW)

( * ) Notice: Subject to any disclaimer, the term of this patent is extended or adjusted under 35 U.S.C. 154(b) by 347 days.

(21) Appl. No.: 11/806,032

(22) Filed: May 29, 2007

(65) Prior Publication Data

US 2008/0296602 A1 Dec. 4, 2008

(51) Int. Cl.
*H01L 33/00* (2006.01)
(52) U.S. Cl. .............................. 257/95; 257/99; 257/79
(58) Field of Classification Search .................. 257/99, 257/95, 79
See application file for complete search history.

(56) References Cited

U.S. PATENT DOCUMENTS 6,495,862 B1 * 12/2002 Okazaki et al. ............. 257/103
2003/0173568 A1 * 9/2003 Asakawa et al. ............ 257/79
2005/0145864 A1 * 7/2005 Sugiyama et al. ........... 257/95
2006/0071226 A1 * 4/2006 Kojima et al. .............. 257/98

* cited by examiner

*Primary Examiner*—Thao X Le
*Assistant Examiner*—Geoffrey Ida
(74) *Attorney, Agent, or Firm*—Birch, Stewart, Kolasch & Birch, LLP

(57) ABSTRACT

A light emitting diode (LED) includes a substrate, a first type epitaxial layer, a light emitting layer, a second type epitaxial layer and a plurality of nano-particles. The first type epitaxial layer is disposed on the substrate. The light emitting layer is disposed on the first type epitaxial layer. The second type epitaxial layer is disposed on the light emitting layer and has one surface formed with a plurality of recesses and a plurality of protrusions. The nano-particles are disposed on the protrusions of the second type epitaxial layer.

6 Claims, 5 Drawing Sheets

LIGHT EMITTING DIODE

BACKGROUND OF THE INVENTION

1. Field of Invention

The invention relates to a diode, and, in particular, to a light emitting diode.

2. Related Art

Light emitting diodes have been merchandised since 1960. Because the light emitting diode can withstand the great vibration, has the long lifetime and consumes less power, it is now widely applied to various products, such as indicators or light sources of home appliance products and various instruments. Recently, the light emitting diode is further applied to the outdoor display, such as a large-scale outdoor display and a traffic signal lamp, in response to the developments of colorfulness and luminance.

In addition, manufacturers further develop high luminance blue, green or red light emitting diodes, or white light emitting diodes in response to the requirements of the user in full-color and high luminance in order to provide better color display effect and higher luminance requirement.

However, the light emitting diodes developed according to various applications still have many problems to be solved. The problems may be, for example, the poor lighting efficiency and the uneven wavelengths of the light emitting diodes.

As mentioned hereinabove, the problem of the poor lighting efficiency of the light emitting diode occurs because the conventional light emitting diode is restricted by the lateral wave guiding phenomenon and the total internal reflection on the crystal surface of the light emitting diode. Thus, the light outputted from the light emitting diode cannot be effectively transferred out of the crystal. That is, a great portion of the output light of the conventional light emitting diode is wasted.

In order to solve the problem of the poor lighting efficiency caused by the total internal reflection, the manufacturers have roughened the crystal surface so as to enhance the lighting efficiency of the light emitting diode. One of the frequently used methods of roughening the surface is to randomly roughen the surface by way of dry etching. Alternatively, an electron-beam lithography method or a light interfering method can be used to form a photon crystal so as to make the crystal surface have a patterned surface roughness.

Referring to FIG. 1, a conventional light emitting diode I mainly includes a substrate 10, an N-type epitaxial layer 11, a light emitting layer 12, a P-type epitaxial layer 13 and a transparent conductive layer 14. A first electrode 111 for the electrical connection is disposed on the N-type epitaxial layer 11, and a second electrode 141 for the electrical connection is disposed on the transparent conductive layer 14. The P-type epitaxial layer 13 is disposed on the light emitting layer 12 and has one surface 130 roughened by an etching process. The transparent conductive layer 14 is disposed on the P-type epitaxial layer 13 and has one surface 140 roughened by another etching process. Thus, the total internal reflection phenomenon can be decreased so that the lighting efficiency can be enhanced according to the surface roughening processes for the P-type epitaxial layer 13 and the transparent conductive layer 14.

After the surface is roughened using the conventional etching process, the lighting efficiency of the light emitting diode can be increased. However, the lighting efficiency cannot be greatly increased. If the crystal surface is roughened by forming the photon crystal, the lighting efficiency of the light emitting diode can be increased more effectively, but the required machine apparatus is more expensive and the mass production cannot be made. That is, this method has higher cost.

Consequently, it is an important subject of the invention to provide a light emitting diode having extremely high lighting efficiency and low cost.

SUMMARY OF THE INVENTION

In view of the foregoing, the invention is to provide a light emitting diode having the extremely high lighting efficiency and the low cost.

To achieve the above, the invention discloses a light emitting diode (LED), which includes a substrate, a first type epitaxial layer, a light emitting layer, a second type epitaxial layer and a plurality of nano-particles. The first type epitaxial layer is disposed on the substrate. The light emitting layer is disposed on the first type epitaxial layer. The second type epitaxial layer is disposed on the light emitting layer and has a surface formed with a plurality of recesses and a plurality of protrusions. The nano-particles are disposed on the protrusions of the second type epitaxial layer.

To achieve the above, the invention discloses a light emitting diode (LED), which includes a substrate, a first type epitaxial layer, a light emitting layer, a second type epitaxial layer, a transparent electrode layer and a plurality of nano-particles. The first type epitaxial layer is disposed on the substrate. The light emitting layer is disposed on the first type epitaxial layer. The second type epitaxial layer is disposed on the light emitting layer. The transparent electrode layer is disposed on the second type epitaxial layer and has a surface formed with a plurality of recesses and a plurality of protrusions. The nano-particles are disposed on the protrusions of the transparent electrode layer.

As mentioned above, a surface of the second type epitaxial layer or the transparent electrode layer is formed with the recesses and the protrusions and the nano-particles are disposed on the protrusions. The surface can be roughened by forming the recesses and the protrusions and disposing the nano-particles on the protrusions so that the lighting efficiency can be increased. In addition, no expensive machine apparatus is need, the mass production can be performed, and thus the manufacturing cost is lower because the recesses and the protrusions are formed on the surface of the second type epitaxial layer or the transparent electrode layer and the nano-particles are disposed on the protrusions by the etching process in the invention.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Figure 1:
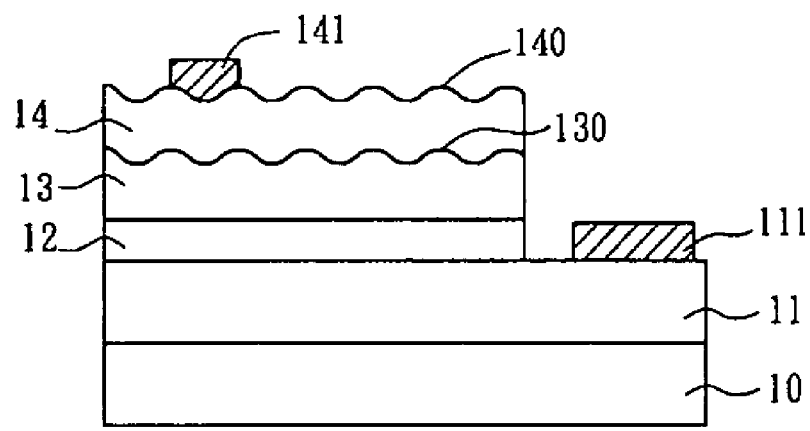
FIG. 1 is a schematically cross-sectional view showing a conventional light emitting diode.
Figure 2:
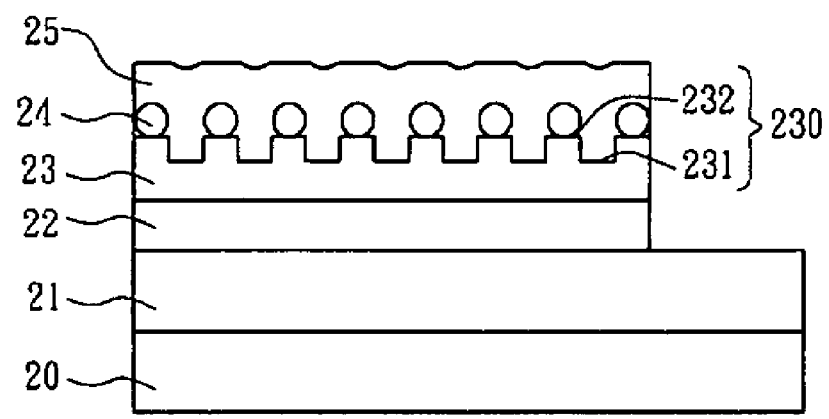
FIG. 2 is a schematically cross-sectional view showing a light emitting diode according to a first embodiment of the invention.

Referring to FIG. 2, a light emitting diode 2 of the invention includes a substrate 20, a first type epitaxial layer 21, a light emitting layer 22, a second type epitaxial layer 23 and a plurality of nano-particles 24. The first type epitaxial layer 21 is disposed on the substrate 20, such as a sapphire substrate. Of course, the substrate 20 can be a substrate made of any other suitable material. The first type epitaxial layer 21 is an N-type epitaxial layer. The light emitting layer 22 is disposed on the first type epitaxial layer 21.

The second type epitaxial layer 23 is disposed on the light emitting layer 22 and has one surface 230 formed with a plurality of recesses 231 and a plurality of protrusions 232. The nano-particles 24 are disposed on the protrusions 232 of the second type epitaxial layer 23. In this embodiment, the nano-particles 24 may contain silicon oxide or polymers. The diameter of the nano-particle 24 preferably ranges from 20 nanometers to 50 microns. The second type epitaxial layer 23 is a P-type epitaxial layer. Alternatively, if the first type epitaxial layer 21 is a P-type epitaxial layer, the second type epitaxial layer 23 is an N-type epitaxial layer.

Referring again to FIG. 2, the light emitting diode 2 of the invention further includes a transparent electrode layer 25 disposed on the second type epitaxial layer 23 and the nano-particles 24. In this embodiment, the material of the transparent electrode layer is indium tin oxide (ITO), indium zinc oxide (IZO), aluminum zinc oxide (AZO), titanium tungsten oxide (TiWO), zinc oxide (ZnO) or their combinations. In addition, the transparent electrode layer 25 may also have a mesh shape.

Figure 3:
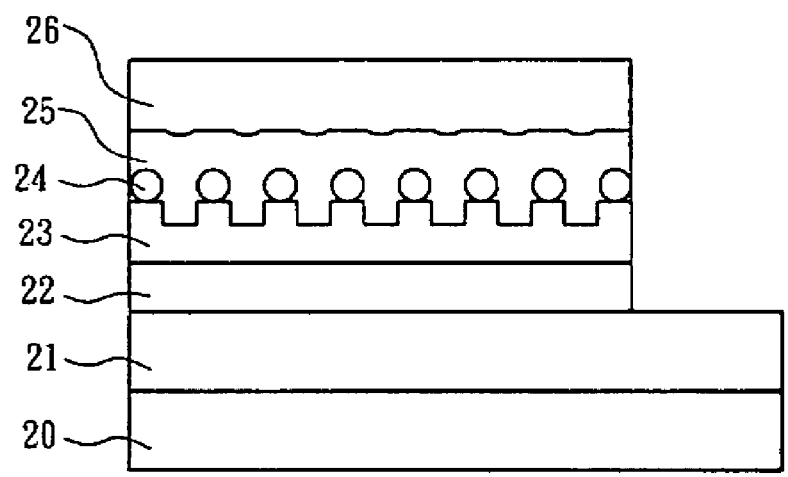
FIG. 3 is a cross-sectional view showing another light emitting diode according to the first embodiment of the invention.

Referring to FIG. 3, the light emitting diode 2 may further include a protection layer 26 disposed on the transparent electrode layer 25. In the embodiment, the material of the protection layer 26 is silicon dioxide (SiO2). Of course, the material of the protection layer 26 may be made of any other suitable material.

To make the invention more comprehensive, the steps for disposing the nano-particles 24 on the protrusions 232 of the second type epitaxial layer 23 will be described hereinafter with reference to FIGS. 4 and 5.

Figure 4:
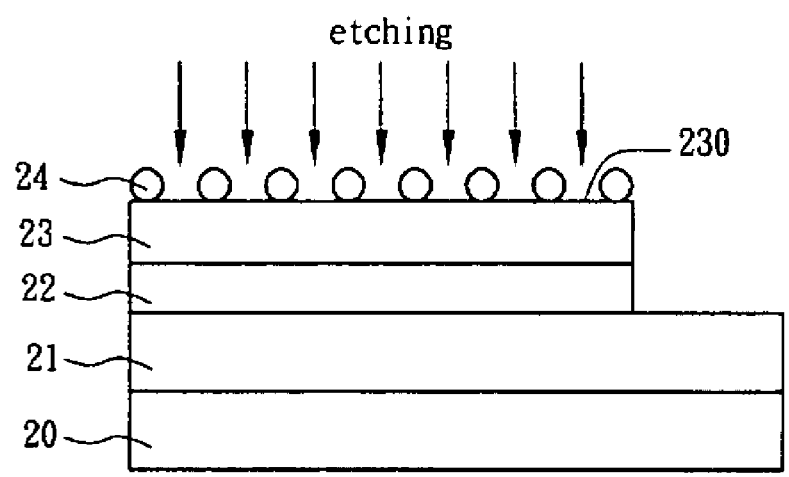
FIG. 4 is a schematically cross-sectional view showing nano-particles disposed on a surface of a second type epitaxial layer in the light emitting diode according to the first embodiment of the invention.
Figure 5:
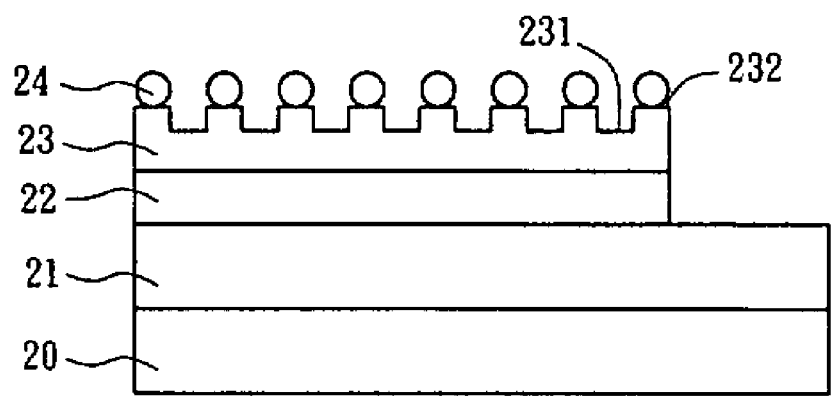
FIG. 5 is a schematically cross-sectional view showing an etched surface of the second type epitaxial layer in the light emitting diode of FIG. 4 according to the first embodiment of the invention.

As shown in FIG. 4, after the second type epitaxial layer 23 is disposed on the light emitting layer 22, the nano-particles 24 are distributed over and disposed on the surface 230 of the second type epitaxial layer 23 followed by the etching process (e.g., dry etching process or wet etching process). In this case, the nano-particles 24 provide a function as an etching mask. In other words, different etching results on the surface 230 of the second type epitaxial layer 23 may be produced according to whether the nano-particles 24 exist. In detail, the surface 230 of the second type epitaxial layer 23 without the nano-particles 24 being disposed thereon is etched to form the recesses 231, and the surface 230 of the second type epitaxial layer 23 with the nano-particles 24 being disposed thereon forms the protrusions 232 corresponding to the recesses 231, as shown in FIG. 5.

In summary, a surface of the second type epitaxial layer is formed with the recesses and the protrusions and the nano-particles are disposed on the protrusions. The surface can be roughened by forming the recesses and the protrusions and disposing the nano-particles on the protrusions so that the lighting efficiency can be increased. In addition, no expensive machine apparatus is need, the mass production can be performed, and thus the manufacturing cost is lower because the recesses and the protrusions are formed on the surface of the second type epitaxial layer and the nano-particles are disposed on the protrusions by the etching process in the invention.

Second Embodiment

The light emitting diode according to the second embodiment of the invention will be described with reference to FIGS. 6 to 8.

Figure 6:
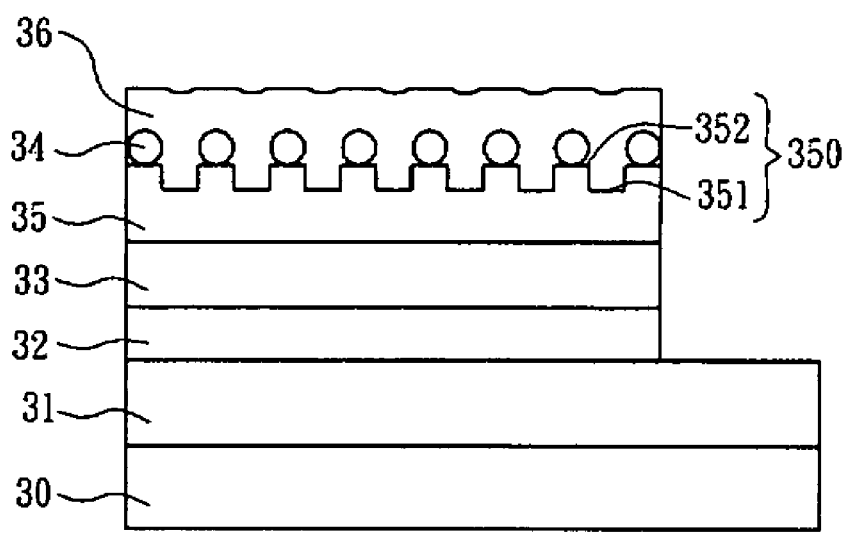
FIG. 6 is a schematically cross-sectional view showing a light emitting diode according to a second embodiment of the invention.

Referring to FIG. 6, a light emitting diode 3 according to the second embodiment of the invention includes a substrate 30, a first type epitaxial layer 31, a light emitting layer 32, a second type epitaxial layer 33, a plurality of nano-particles 34 and a transparent electrode layer 35. In the embodiment, the first type epitaxial layer 31 is disposed on the substrate 30 such as a sapphire substrate. Of course, the substrate 30 can be made of another suitable material. The first type epitaxial layer 31 is an N-type epitaxial layer. The light emitting layer 32 is disposed on the first type epitaxial layer 31. The second type epitaxial layer 33 is disposed on the light emitting layer 32.

The transparent electrode layer 35 is disposed on the second type epitaxial layer 33 and has one surface 350 formed with a plurality of recesses 351 and a plurality of protrusions 352. In this embodiment, the material of the transparent electrode layer 35 may be indium tin oxide (ITO), indium zinc oxide (IZO), aluminum zinc oxide (AZO), titanium tungsten oxide (TiWO), zinc oxide (ZnO) or their combinations. The nano-particles 34 are disposed on the protrusions 352 of the transparent electrode layer 35. In this embodiment, the nano-particles 34 may contain silicon oxide or polymers. The diameter of the nano-particle 34 preferably ranges from 20 nanometers to 50 microns. The second type epitaxial layer 33 is a P-type epitaxial layer. Alternatively, if the first type epitaxial layer 31 is a P-type epitaxial layer, the second type epitaxial layer 33 is an N-type epitaxial layer.

Referring to FIG. 6, the light emitting diode 3 of this invention further includes a protection layer 36 disposed on the transparent electrode layer 35 and the nano-particles 34. In this embodiment, the material of the protection layer 36 is silicon dioxide (SiO2). Of course, the protection layer 26 may be made of any other suitable material.

To make the invention more comprehensive, the steps for disposing the nano-particles 324 on the protrusions 352 of the transparent electrode layer 35 will be described hereinafter with reference to FIGS. 7 and 8.

Figure 7:
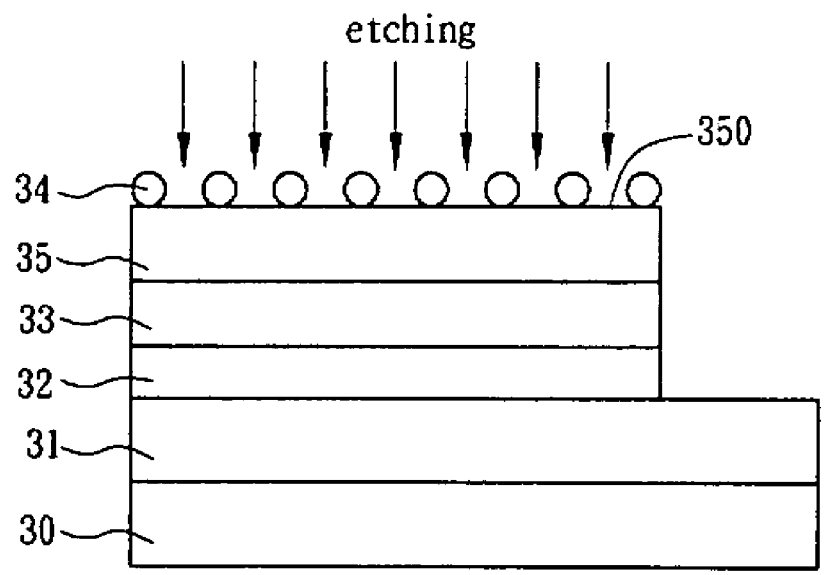
FIG. 7 is a schematically cross-sectional view showing nano-particles disposed on a surface of a transparent electrode layer in the light emitting diode according to the second embodiment of the invention.
Figure 8:
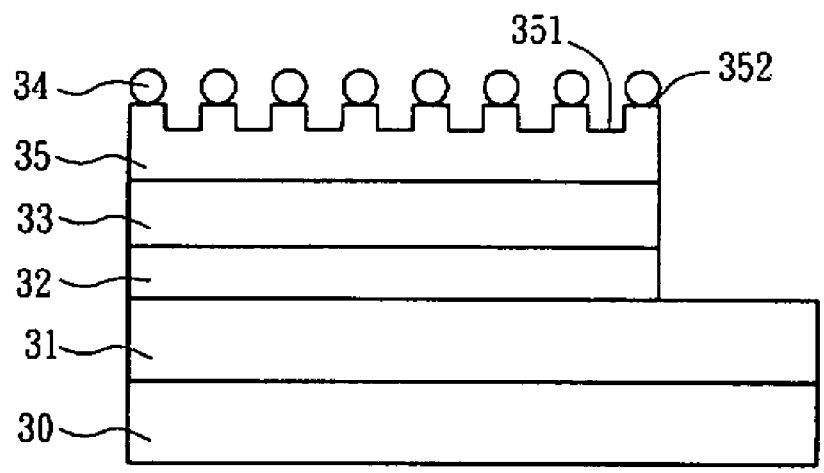
FIG. 8 is a schematically cross-sectional view showing an etched surface of the transparent electrode layer in the light emitting diode of FIG. 7 according to the second embodiment of the invention.

As shown in FIG. 7, after the transparent electrode layer 35 is disposed on the second type epitaxial layer 33, the nano-particles. 34 are distributed over and disposed on the surface 350 of the transparent electrode layer 35 followed by the etching process (e.g., dry etching process or wet etching process). In this case, the nano-particles 34 provide a function as an etching mask. In other words, different etching results on the surface 350 of the transparent electrode layer 35 may be produced according to whether the nano-particles 34 exist. In detail, the surface 350 of the transparent electrode layer 35 without the nano-particles 34 being disposed thereon is etched to form the recesses 351, and the surface 350 of the transparent electrode layer 35 with the nano-particles 34 being disposed thereon forms the protrusions 352 corresponding to the recesses 351, as shown in FIG. 8.

In this embodiment, if the transparent electrode layer 35 is a mesh-type transparent electrode layer, the nano-particles 34 are partially distributed over the surface 350 of the transparent electrode layer 35, and also partially distributed over the second type epitaxial layer 33. In other words, a part of the surface 350 of the transparent electrode layer 35 without the nano-particles 34 being disposed thereon is etched to form the recesses 351, and the other part of the surface 350 of the transparent electrode layer 35 with the nano-particles 34 being disposed thereon forms the protrusions 352 corresponding to the recesses 351.

In summary, a surface of the transparent electrode layer is formed with the recesses and the protrusions and the nano-particles are disposed on the protrusions. The surface can be roughened by forming the recesses and the protrusions and disposing the nano-particles on the protrusions so that the lighting efficiency can be increased. In addition, no expensive machine apparatus is need, the mass production can be performed, and thus the manufacturing cost is lower because the recesses and the protrusions are formed on the transparent electrode layer and the nano-particles are disposed on the protrusions by the etching process in the invention.

Third Embodiment

The light emitting diode according to the third embodiment of the invention will be described with reference to FIG. 9. It is to be noted that the roughening technology of the third embodiment is similar to those of the first and second embodiments. So, the detailed descriptions associated with the roughening technology are omitted, and only the differences therebetween will be described in the following.

Figure 9:
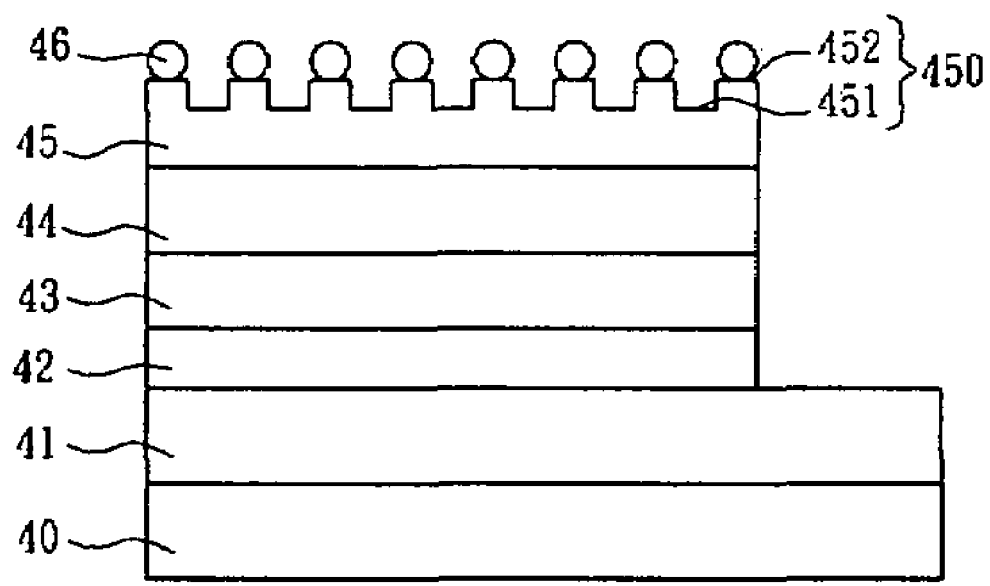
FIG. 9 is a schematically cross-sectional view showing a light emitting diode according to a third embodiment of the invention.

Referring to FIG. 9, a light emitting diode 4 includes a substrate 40, a first type epitaxial layer 41, a light emitting layer 42, a second type epitaxial layer 43, a transparent electrode layer 44, a protection layer 45 and a plurality of nano-particles 46. The first type epitaxial layer 41 is disposed on the substrate 40 such as a sapphire substrate. Of course, the substrate 40 may be made of any other suitable material. The first type epitaxial layer 41 is an N-type epitaxial layer. The light emitting layer 42 is disposed on the first type epitaxial layer 41. The second type epitaxial layer 43 is disposed on the light emitting layer 42.

The transparent electrode layer 44 is disposed on the second type epitaxial layer 43. In this embodiment, the material of the transparent electrode layer 44 may be indium tin oxide (ITO), indium zinc oxide (IZO), aluminum zinc oxide (AZO), titanium tungsten oxide (TiWO), zinc oxide (ZnO) or their combinations.

As shown in FIG. 9, the protection layer 45 is disposed on the transparent electrode layer 44 and has a surface 450 formed with a plurality of recesses 451 and a plurality of protrusions 452. The nano-particles 46 are disposed on the protrusions 452 of the protection layer 45. In this embodiment, the nano-particles 46 may contain silicon oxide or polymers. The diameter of the nano-particle 46 preferably ranges from 20 nanometers to 50 microns. The second type epitaxial layer 43 is a P-type epitaxial layer. Of course, if the first type epitaxial layer 41 is a P-type epitaxial layer, the second type epitaxial layer 43 is an N-type epitaxial layer.

In summary, a surface of the protection layer is formed with the recesses and the protrusions and the nano-particles are disposed on the protrusions. The surface can be roughened by forming the recesses and the protrusions and disposing the nano-particles on the protrusions so that the lighting efficiency can be increased. In addition, no expensive machine apparatus is need, the mass production can be performed, and thus the manufacturing cost is lower because the recesses and the protrusions are formed on the protection layer and the nano-particles are disposed on the protrusions by the etching process in the invention.

To be noted that although only one layer of the multi-layer structure is formed with the nano-particle structure in each of the first to third embodiments, arbitrary two or more layers of the light emitting diode may be formed with the nano-particle structure in practice.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A light emitting diode (LED), comprising:
   a substrate;
   a first type epitaxial layer disposed on the substrate;
   a light emitting layer disposed on the first type epitaxial layer;
   a second type epitaxial layer disposed on the light emitting layer;
   a transparent electrode layer disposed on the second type epitaxial layer;
   a protection layer disposed on the transparent electrode layer and having a surface formed with a plurality of recesses and a plurality of protrusions; and
   a plurality of nano-particles disposed on the protrusions of the protection layer.

2. The LED according to claim 1, wherein a material of the protection layer is silicon dioxide.

3. The LED according to claim 1, wherein the substrate is a sapphire substrate.

4. The LED according to claim 1, wherein the first type epitaxial layer is an N-type epitaxial layer or a P-type epitaxial layer, and the second type epitaxial layer is a P-type epitaxial layer or an N-type epitaxial layer.

5. The LED according to claim 1, wherein the nano-particles contain silicon oxide or polymers.

6. The LED according to claim 1, wherein a diameter of each of the nano-particles ranges from 20 nanometers to 50 microns.

* * * * *